(12) United States Patent
Henson et al.

(10) Patent No.: US 7,658,526 B2
(45) Date of Patent: Feb. 9, 2010

(54) ILLUMINATION SYSTEM USING A PLURALITY OF LIGHT SOURCES

(75) Inventors: Gordon D. Henson, Lake Elmo, MN (US); Barbara A. DeBaun, Woodbury, MN (US); Michael A. Meis, Stillwater, MN (US); John C. Schultz, Afton, MN (US); John J. Simbal, Lakeway, TX (US); Ronald D. Davis, Cottage Grove, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 141 days.

(21) Appl. No.: 12/046,815

(22) Filed: Mar. 12, 2008

(65) Prior Publication Data

US 2009/0059614 A1 Mar. 5, 2009

Related U.S. Application Data

(62) Division of application No. 11/618,403, filed on Dec. 29, 2006, now Pat. No. 7,360,924.

(51) Int. Cl.
*G02B 6/04* (2006.01)

(52) U.S. Cl. .................. 362/554; 362/511; 362/558; 362/241

(58) Field of Classification Search ............... 362/554, 362/558, 511
See application file for complete search history.

(56) References Cited

U.S. PATENT DOCUMENTS

| | | | |
|---|---|---|---|
| 3,825,335 A | 7/1974 | Reynolds | |
| 3,902,059 A | 8/1975 | McNamara | |
| 4,544,259 A | 10/1985 | Kanaoka et al. | |
| 4,755,918 A | 7/1988 | Pristash et al. | |
| 4,897,771 A | 1/1990 | Parker | |
| 4,964,025 A | 10/1990 | Smith | |

(Continued)

FOREIGN PATENT DOCUMENTS

DE 199 23 187 11/2000

(Continued)

OTHER PUBLICATIONS

Hsu, J.T. et al., "Design of multi-chips LED module for lighting application", *Solid State Lighting II, Proceedings of SPIE* (2002), vol. 4776, pp. 26-33.

(Continued)

*Primary Examiner*—Ali Alavi
(74) *Attorney, Agent, or Firm*—Lance C. Vietzke

(57) ABSTRACT

An illumination system includes a plurality of radiation generating sources, such as LED dies. A corresponding plurality of optical waveguides is also provided, with each waveguide having a first and a second end, with each first end being in optical communication with the corresponding LED die. An array of corresponding passive optical elements is interposed between the plurality of LED dies and the corresponding first ends of the plurality of optical waveguides. The illumination system provides for substantially high light coupling efficiency and an incoherent light output that can appear to the human observer as arising from a single point of light. In addition, the light can be output remotely at one or more locations and in one or more directions.

16 Claims, 10 Drawing Sheets

U.S. PATENT DOCUMENTS

| | | | |
|---|---|---|---|
| 5,146,248 A | 9/1992 | Duwaer et al. | |
| 5,212,710 A | 5/1993 | Kaneda et al. | |
| 5,227,008 A | 7/1993 | Klun et al. | |
| 5,293,437 A | 3/1994 | Nixon | |
| 5,299,222 A | 3/1994 | Shannon et al. | |
| 5,301,090 A * | 4/1994 | Hed | 362/558 |
| 5,302,999 A | 4/1994 | Oshida et al. | |
| 5,317,484 A | 5/1994 | Davenport et al. | |
| 5,337,325 A * | 8/1994 | Hwang | 372/36 |
| 5,420,768 A | 5/1995 | Kennedy | |
| 5,534,718 A | 7/1996 | Chang | |
| 5,567,032 A | 10/1996 | Helzmann | |
| 5,574,817 A | 11/1996 | Henson et al. | |
| 5,580,471 A | 12/1996 | Fukumoto et al. | |
| 5,611,017 A | 3/1997 | Lee et al. | |
| 5,629,996 A | 5/1997 | Rizkin et al. | |
| 5,634,711 A | 6/1997 | Kennedy et al. | |
| 5,661,839 A | 8/1997 | Whitehead | |
| 5,693,043 A | 12/1997 | Kittrell et al. | |
| 5,709,463 A | 1/1998 | Igram | |
| 5,713,654 A | 2/1998 | Scifres | |
| 5,727,108 A | 3/1998 | Hed | |
| 5,748,816 A | 5/1998 | Jaksic et al. | |
| 5,808,794 A | 9/1998 | Weber et al. | |
| 5,810,469 A | 9/1998 | Weinreich | |
| 5,816,694 A | 10/1998 | Ideker et al. | |
| 5,882,774 A | 3/1999 | Jonza et al. | |
| 5,886,313 A | 3/1999 | Krause et al. | |
| 5,959,316 A | 9/1999 | Lowery | |
| 5,967,653 A | 10/1999 | Miller et al. | |
| 6,002,466 A | 12/1999 | Brauch et al. | |
| 6,045,240 A | 4/2000 | Hochstein | |
| 6,075,595 A | 6/2000 | Malien | |
| 6,104,446 A | 8/2000 | Blankenbecler et al. | |
| 6,155,699 A | 12/2000 | Miller et al. | |
| 6,172,810 B1 | 1/2001 | Fleming et al. | |
| 6,195,016 B1 * | 2/2001 | Shankle et al. | 340/815.42 |
| 6,200,134 B1 | 3/2001 | Kovac et al. | |
| 6,224,216 B1 | 5/2001 | Parker et al. | |
| 6,236,382 B1 | 5/2001 | Kawakami et al. | |
| 6,290,382 B1 * | 9/2001 | Bourn et al. | 362/554 |
| 6,340,824 B1 | 1/2002 | Komoto et al. | |
| 6,343,872 B1 | 2/2002 | Cerone et al. | |
| 6,350,041 B1 | 2/2002 | Tarsa et al. | |
| 6,395,564 B1 | 5/2002 | Huang | |
| 6,402,347 B1 * | 6/2002 | Maas et al. | 362/294 |
| 6,406,172 B1 | 6/2002 | Harbers et al. | |
| 6,414,801 B1 | 7/2002 | Roller | |
| 6,417,917 B1 | 7/2002 | Jung et al. | |
| 6,428,198 B1 * | 8/2002 | Saccomanno et al. | 362/559 |
| 6,434,327 B1 | 8/2002 | Gronet et al. | |
| 6,521,915 B2 | 2/2003 | Odaki et al. | |
| 6,527,411 B1 * | 3/2003 | Sayers | 362/245 |
| 6,541,800 B2 | 4/2003 | Barnett et al. | |
| 6,556,734 B1 | 4/2003 | Bischel et al. | |
| 6,560,038 B1 | 5/2003 | Parkyn, Jr. et al. | |
| 6,587,573 B1 | 7/2003 | Stam et al. | |
| 6,603,258 B1 | 8/2003 | Mueller-Mach et al. | |
| 6,608,332 B2 | 8/2003 | Shimizu et al. | |
| 6,614,172 B2 | 9/2003 | Chiu et al. | |
| 6,692,250 B1 | 2/2004 | Decaudin et al. | |
| 6,727,518 B2 | 4/2004 | Uemura et al. | |
| 6,733,711 B2 | 5/2004 | Durocher et al. | |
| 6,777,870 B2 | 8/2004 | Sundahl | |
| 6,809,342 B2 | 10/2004 | Harada | |
| 6,821,143 B2 | 11/2004 | Gasquet et al. | |
| 6,822,190 B2 | 11/2004 | Henson et al. | |
| 6,832,861 B2 | 12/2004 | Kragl | |
| 6,874,910 B2 | 4/2005 | Sugimoto et al. | |
| 6,901,090 B1 | 5/2005 | Ohtsuki | |
| 6,921,920 B2 | 7/2005 | Kazakevich | |
| 6,943,380 B2 | 9/2005 | Ota et al. | |
| 6,949,772 B2 | 9/2005 | Shimizu et al. | |
| 6,954,565 B2 | 10/2005 | Lindt | |
| 6,960,035 B2 | 11/2005 | Okazaki et al. | |
| 7,029,277 B2 | 4/2006 | Gofman et al. | |
| 7,055,987 B2 | 6/2006 | Staufert | |
| 7,091,653 B2 | 8/2006 | Ouderkirk et al. | |
| 7,118,438 B2 | 10/2006 | Ouderkirk et al. | |
| 7,163,327 B2 | 1/2007 | Henson et al. | |
| 7,245,072 B2 | 7/2007 | Ouderkirk et al. | |
| 7,250,611 B2 | 7/2007 | Aguirre et al. | |
| 2001/0001207 A1 | 5/2001 | Shimizu et al. | |
| 2001/0010449 A1 | 8/2001 | Chiu et al. | |
| 2001/0033712 A1 | 10/2001 | Cox et al. | |
| 2002/0018199 A1 | 2/2002 | Blumenfled et al. | |
| 2002/0024055 A1 | 2/2002 | Uemura et al. | |
| 2002/0113244 A1 | 8/2002 | Barnett et al. | |
| 2002/0126479 A1 | 9/2002 | Zhai et al. | |
| 2002/0171047 A1 | 11/2002 | Chan et al. | |
| 2002/0176251 A1 | 11/2002 | Plank et al. | |
| 2003/0001488 A1 | 1/2003 | Sundahl | |
| 2003/0042493 A1 | 3/2003 | Kazakevich | |
| 2003/0052594 A1 | 3/2003 | Matsui et al. | |
| 2003/0057421 A1 | 3/2003 | Chen | |
| 2003/0068113 A1 | 4/2003 | Janz et al. | |
| 2003/0091277 A1 | 5/2003 | Mei | |
| 2003/0117691 A1 | 6/2003 | Bi et al. | |
| 2003/0142500 A1 | 7/2003 | Bachl et al. | |
| 2003/0173575 A1 | 9/2003 | Eisert et al. | |
| 2003/0175000 A1 | 9/2003 | Caracci et al. | |
| 2003/0178627 A1 | 9/2003 | Marchl et al. | |
| 2003/0185508 A1 | 10/2003 | Fukuyama et al. | |
| 2003/0189829 A1 | 10/2003 | Shimizu et al. | |
| 2003/0214571 A1 | 11/2003 | Ishikawa et al. | |
| 2003/0231843 A1 | 12/2003 | Colombo et al. | |
| 2003/0233138 A1 | 12/2003 | Spooner | |
| 2003/0235800 A1 | 12/2003 | Quadar | |
| 2004/0008952 A1 | 1/2004 | Kragl | |
| 2004/0106968 A1 | 6/2004 | Yamada | |
| 2004/0159900 A1 | 8/2004 | Ouderkirk et al. | |
| 2004/0164325 A1 | 8/2004 | Siegel | |
| 2004/0166249 A1 | 8/2004 | Siegel | |
| 2004/0190573 A1 | 9/2004 | Kruschwitz et al. | |
| 2004/0262053 A1 | 12/2004 | Ludewig et al. | |
| 2005/0069256 A1 | 3/2005 | Jennings et al. | |
| 2005/0116235 A1 | 6/2005 | Schultz et al. | |
| 2005/0116635 A1 | 6/2005 | Watson et al. | |
| 2005/0117366 A1 | 6/2005 | Simbal | |
| 2005/0134527 A1 | 6/2005 | Ouderkirk et al. | |
| 2005/0140270 A1 | 6/2005 | Henson et al. | |
| 2005/0162737 A1 | 7/2005 | Whitehead et al. | |
| 2005/0177208 A1 | 8/2005 | Irwin | |
| 2006/0011928 A1 | 1/2006 | Sorg et al. | |
| 2006/0044531 A1 | 3/2006 | Potekev | |
| 2007/0103925 A1 | 5/2007 | Henson et al. | |

FOREIGN PATENT DOCUMENTS

| | | |
|---|---|---|
| DE | 100 25 563 | 12/2001 |
| DE | 201 11 814 | 12/2001 |
| DE | 201 20 770 | 5/2002 |
| DE | 101 10 835 | 9/2002 |
| DE | 101 34 381 | 1/2003 |
| DE | 101 62 404 | 7/2003 |
| EP | 0 181 193 | 5/1986 |
| EP | 0 249 934 | 12/1987 |
| EP | 0 303 741 | 2/1989 |
| EP | 0 338 641 | 10/1989 |
| EP | 0 490 292 | 6/1992 |
| EP | 0 588 040 | 3/1994 |
| EP | 0 889 495 | 1/1999 |
| EP | 1 067 332 | 1/2001 |
| EP | 1 081 771 | 3/2001 |

| | | |
|---|---|---|
| EP | 1 108 949 | 6/2001 |
| EP | 1 241 510 | 3/2002 |
| EP | 1 241 510 | 9/2002 |
| EP | 1 241 869 | 9/2002 |
| EP | 1 260 196 | 11/2002 |
| FR | 2 662 896 | 12/1991 |
| JP | 2-142695 | 5/1990 |
| JP | 2-189803 | 7/1990 |
| JP | 07240536 | 9/1995 |
| JP | 08-008463 | 1/1996 |
| JP | 10-256694 | 9/1998 |
| JP | 11-284233 | 10/1999 |
| JP | 2002-065603 | 3/2002 |
| WO | WO 95/20811 | 8/1995 |
| WO | WO 99/41785 | 8/1999 |
| WO | WO 01/59360 | 8/2001 |
| WO | WO 02/086972 | 10/2002 |
| WO | WO 03/077013 | 9/2003 |
| WO | WO 03/096387 | 11/2003 |
| WO | WO 2004/081475 | 9/2004 |
| WO | WO 2005/062382 | 7/2005 |

OTHER PUBLICATIONS

U.S. Appl. No. 60/430,230, filed Dec 2, 2002—Illumination System Using a Plurality of Remote Light Sources.
U.S. Appl. No. 60/443,232, filed Jan. 27, 2003—Methods of Making LED-excited Phosphor- based Light Sources.
U.S. Appl. No. 60/443,235, filed Jan. 27, 2003—LED-excited Phosphor-based Light Sources with Front Illumination.
U.S. Appl. No. 60/443,274, filed Jan. 27, 2003—LED-excited Phosphor-based Light Sources.
"Solid-State Laser/Fiber Optic-Expose Machine", IBM Technical Disclosure Bulletin, IBM Corp. vol. 30, No. 10, New York, Mar. 1, 1988, pp. 249-250.
Zukauskas et al., *Introduction to Solid-State Lighting*, pp. 166-167, John Wiley & Sons, Inc., New York, 2002.

* cited by examiner

ILLUMINATION SYSTEM USING A PLURALITY OF LIGHT SOURCES

RELATED APPLICATIONS

The present application is a divisional of U.S. patent application Ser. No. 11/618,403, filed Dec. 29, 2006 now U.S. Pat. No. 7,360,924, which claims the benefit of U.S. patent application Ser. No. 10/726,222, filed on Dec. 2, 2003, which claims the benefit of U.S. Provisional Patent Application No. 60/430,230, filed on Dec. 2, 2002, the entirety of which is incorporated by reference herein. The present application is also related to co-owned U.S. Patent Publication No. 2005/0140270, filed on Dec. 2, 2003; U.S. Patent Publication No. 2005/0117366, filed on Dec. 2, 2003; U.S. Patent Publication No. 2005/0116635, filed on Dec. 2, 2003; and U.S. Patent Publication No. 2005/0116235, filed on Dec. 2, 2003, each of which are incorporated by reference herein in their entirety.

BACKGROUND OF THE INVENTION

1. Field of the Invention

The present invention relates to a lighting or illumination assembly and system. More particularly, the present invention relates to a high coupling efficiency illumination system including a plurality of light sources.

2. Background Art

Illumination systems are used in a variety of applications. Home, medical, dental, and industrial applications often require light to be made available. Similarly, aircraft, marine, and automotive applications require high-intensity illumination beams.

Traditional lighting systems have used electrically powered filament or arc lamps, which sometimes include focusing lenses and/or reflective surfaces to direct the produced illumination into a beam. However, in certain applications, such as in swimming pool lighting, the final light output may be required to be placed in environments in which electrical contacts are undesirable. In other applications, such as automobile headlights, there exists a desire to move the light source from exposed, damage-prone positions to more secure locations. Additionally, in yet other applications, limitations in physical space, accessibility, or design considerations may require that the light source be placed in a location different from where the final illumination is required.

In response to some of these needs, illumination systems have been developed using optical waveguides to guide the light from a light source to a desired illumination point. One current approach is to use either a bright single light source or a cluster of light sources grouped closely together to form a single illumination source. The light emitted by such a source is directed with the aide of focusing optics into a single optical waveguide, such as a large core plastic optical fiber, that transmits the light to a location that is remote from the source/sources. In yet another approach, the single fiber may be replaced by a bundle of individual optical fibers.

The present methods are very inefficient with approximately 70% loss of the light generated in some cases. In multiple fiber systems, these losses may be due to the dark interstitial spaces between fibers in a bundle and the efficiencies of directing the light into the fiber bundle. In single fiber systems, a single fiber having a large enough diameter to capture the amount of light needed for bright lighting applications becomes too thick and loses the flexibility to be routed and bent in small radii.

Some light generating systems have used lasers as sources, to take advantage of their coherent light output and/or low divergence angle. However, laser sources typically produce a single wavelength output color whereas an illumination system typically requires a more broadband white light source. For example, U.S. Pat. No. 5,299,222 discusses the use of single wavelength high-power laser diodes to couple energy into a wavelength sensitive gain medium, as opposed to use as an illumination source. The use of the specified laser diodes, with their asymmetrical beam shape, requires the extensive use of optical beam shaping elements in order to achieve more efficient coupling into the optical fibers. Also, some laser diodes are expensive to utilize since they require stringent temperature control (e.g., the need for using thermoelectric coolers, and the like) due to the heat they generate in operation. In addition, a concentrated array of packaged LEDs can lead to problems in the area of thermal management.

The need remains for a lighting system that can deliver high-intensity illumination using a light source.

SUMMARY OF THE INVENTION

The present invention relates to a lighting or illumination assembly. More particularly, the present invention relates to a high coupling efficiency illumination system including a plurality of light sources that can be arranged remotely from the illumination output.

A lighting or illumination system, referred to herein as an illumination device, in accordance with the present invention comprises a plurality of LED dies, a corresponding plurality of optical waveguides, each having first and second ends, each first end being in optical communication with the corresponding LED die, and an array of corresponding optical elements interposed between the plurality of LED dies and the corresponding first ends of the plurality of optical waveguides.

In exemplary embodiments, the light sources are individual LED dies or chips, or laser diodes. The waveguides may include optical fibers, such as polymer clad silica fibers. The first ends of the plurality of optical waveguides receive the light emitted from the light sources. The second ends of the plurality of optical waveguides may be bundled or arrayed to form a single light illumination source when illuminated.

The optical elements may include passive optical elements, such as an array of input light-directing or concentrating elements, wherein each waveguide first end is in optical communication with at least one light directing/concentrating element and wherein the array of light directing/concentrating elements is in optical communication with and interposed between the LED dies and the first ends of the plurality of optical waveguides.

In an exemplary embodiment, the array of optical elements comprises an array of reflectors. These reflectors can be shaped to preserve or maintain the small étendue of the LED die light source and to substantially match this étendue to the étendue (which is proportional to the product of the core area and acceptance angle) of the light receiving fiber. The array of reflectors can be formed in a substrate, such as a multilayer optical film (MOF) or a metallized substrate or sheeting.

The illumination device may further comprise at least one output light-directing element, such as a collimating, collecting, or beam shaping element that directs light from the second ends to form a single illumination source. The output light-directing elements may comprise an array of light-directing elements, wherein each second end is in optical communication with at least one light-directing element.

Alternatively, the plurality of waveguides may comprise a plurality of optical fibers and the output light-directing elements comprise fiber lenses on each second end of the plurality of optical fibers. Similarly, the first end of the optical fibers may further comprise a fiber lens.

In another embodiment, the illumination device further includes a second plurality of LED dies and a second plurality of optical waveguides, each having first and second ends, each first end of the second plurality of optical waveguides being in optical communication with one of the second plurality of LED dies. In an exemplary embodiment, the second ends of the second plurality of optical waveguides are bundled with the second ends of the first plurality of optical waveguides to form a single light illumination source when illuminated. Alternatively, the second ends of the first plurality of optical waveguides are formed in a first bundle and the second ends of the second plurality of optical waveguides are formed in a second bundle to form separate illuminating outputs that can be directed in the same or in different directions.

These first and second light sources may have different emission spectra. In one particular embodiment, the emission spectrum of the first plurality of LED dies is essentially white light, while the second plurality of LED dies includes an infrared source. In another embodiment, the two (or more) pluralities of LED dies include different colors to allow for the blending non-white colors. The first and second pluralities of LED dies may be illuminated individually or collectively to vary the intensity of the illumination source.

Additionally, the system may comprise at least one output optical element that is optically coupled to direct output light from the second ends of the first plurality of optical waveguides along a first path and a second output optical element that is optically coupled to direct output light from the second ends of the second plurality of optical waveguides along a second path.

Such embodiments may be applied as a headlight illumination system for an automobile or other vehicle or platform. In one exemplary embodiment, the intensity of the headlight beam can be controlled by illuminating a particular number of LED chips of the array of light sources. For example, a first plurality of LED dies may be illuminated for a low beam and the first and/or a second plurality of LED dies may be illuminated for a high beam.

In another exemplary embodiment, the illumination system can further comprise an infrared sensor for, e.g., collision detection, illumination, and/or telemetry applications.

The above summary of the present invention is not intended to describe each illustrated embodiment or every implementation of the present invention. The figures and the detailed description that follow more particularly exemplify these embodiments.

Figure 1:
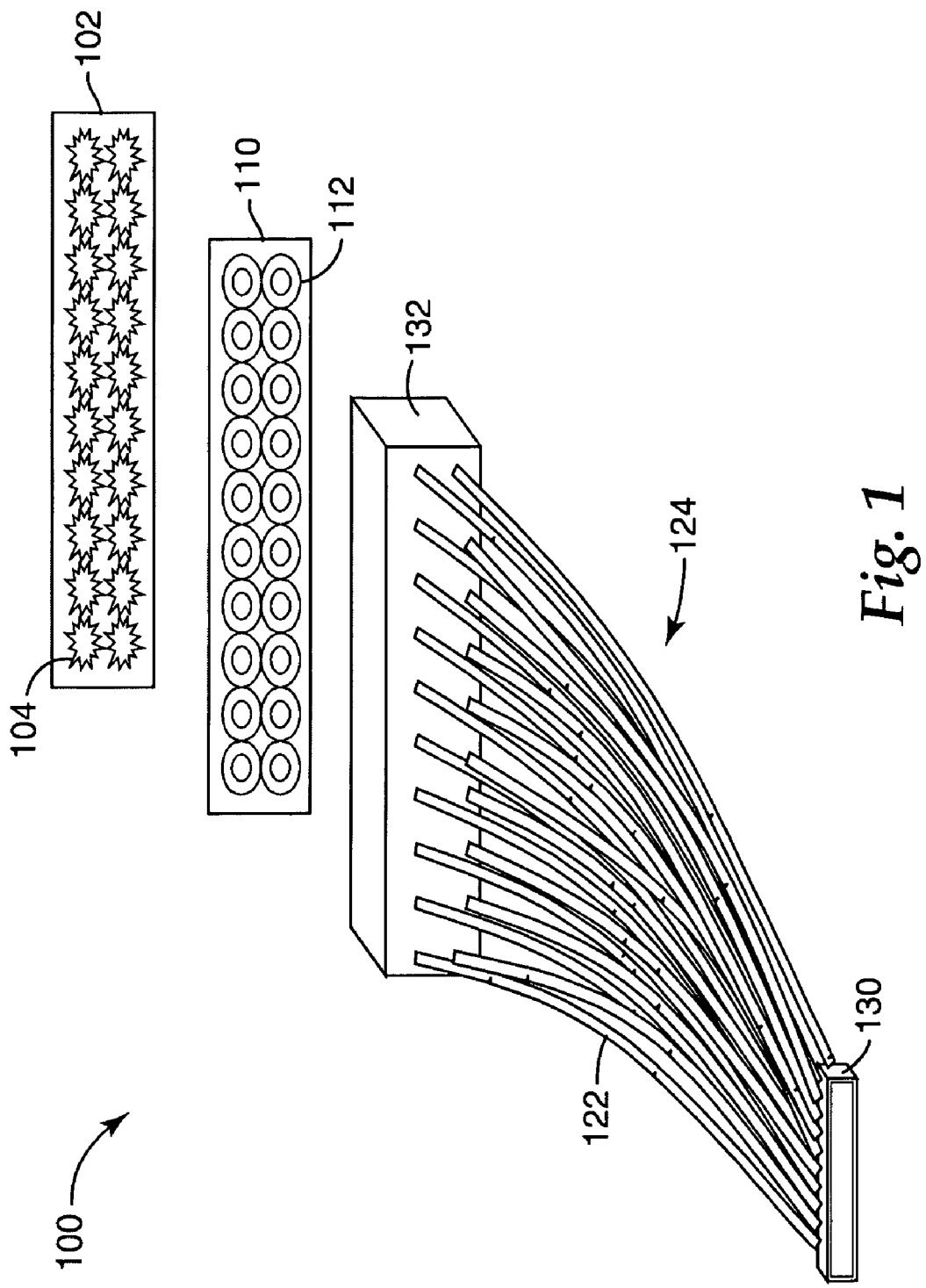
FIG. 1 is a perspective view of an illumination system in accordance with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF THE INVENTION

Generally, previous optical fiber lighting designs suffered from high coupling losses and were therefore very inefficient. An illumination system in accordance with the present invention provides for substantially higher light coupling efficiency. Furthermore, the illumination system of the present invention offers an incoherent light output that can appear to the human observer as arising from a single point of light. In addition, exemplary embodiments of the present invention show that an array of LED dies can be utilized to provide a high density, remote source of light that can be output at one or more locations. Moreover, exemplary embodiments of the present invention provide an array of LED dies that can be utilized to provide a high density, remote source of light that can produce one color, or multiple colors, either individually, or simultaneously, at one or more locations. In addition, the colors or color combinations of the source may be made changeable to suit particular requirements of applications as conditions of use vary during operation. Other exemplary embodiments are discussed below.

FIG. 1 illustrates an exemplary first embodiment of a remote lighting system 100 in accordance with an embodiment of the present invention. An array 102 of bright LED dies 104 are positioned in optical alignment with an array of optical elements 110, which can include a plurality of passive optical elements, such as focusing lenses 112 or optical concentrating elements, such as reflectors 120 (see FIG. 2). The array of optical elements 110 are in turn optically aligned to an array of waveguides 124, which can include a plurality of optical waveguides, such as optical fibers 122. The array of waveguides 124 can be connectorized, where the connectorization can include a connector 132 to support and/or house the light-receiving ends of fibers 122. The connectorization can also include a connector 130 to support and/or house the output ends of fibers 122. Exemplary connector structures are shown in FIGS. 8-11, described below. As would be apparent to one of ordinary skill in the art given the present description, the output ends of the fibers 122 may be bundled to form a point-like source or a shaped-array, such as a linear array, circular array, or other shaped-array.

The array 102 is made out of an array of discrete LEDs 104, such as an array of single LED dies or chips, which are mounted individually and have independent electrical connections for operational control (rather than an LED array where all the LEDs are connected to each other by their common semiconductor substrate). LED dies can produce a symmetrical radiation pattern, making them desirable light sources for the present invention. LED dies are efficient at converting electrical energy to light and are not as temperature sensitive as most laser diodes. Therefore, LED dies may operate adequately with only a modest heat sink compared to many types of laser diodes. In an exemplary embodiment, each LED die is spaced apart from its nearest neighbor(s) by at least a distance greater than an LED die width.

In addition, LED dies can be operated at a temperature from −40° to 125° C. and can have operating lifetimes in the range of 100,000 hours, as compared to most laser diode lifetimes around 10,000 hours or halogen automobile headlamp lifetimes of 500-1000 hours. In an exemplary embodiment, the LED dies can each have an output intensity of about 50 Lumens or more. Discrete high-power LED dies are commercially available from companies such as Cree and Osram. In one exemplary embodiment, an array of LED dies (manufactured by Cree), each having an emitting area of about 300 μm×300 μm, can be used to provide a concentrated (small area, high power) light source. Other light emitting surface shapes such as rectangular or other polygonal shapes can also be utilized. In addition, in alternative embodiments, the emission layer of the LED dies utilized can be located on the top or bottom surface.

In an alternative embodiment, the LED array may be replaced with a white VCSEL array. The passive optical element array 110 may be used to redirect that light emitted from each VCSEL into a corresponding fiber 122.

An aspect of the illustrated embodiment of FIG. 1 is the one-to-one correspondence between each light source, a corresponding passive optical element (lens, focusing, concentrating, or reflective element), and a corresponding waveguide. When powered, each LED die 104 acts as an individual light source that launches light into a corresponding flexible individual fiber 122. The present exemplary embodiment includes large-core (for example, 400 μm to 1000 μm) polymer clad silica fibers (such as those marketed under the trade designation TECS™, available from 3M Company, St. Paul, Minn.). Other types of optical fibers, such as conventional or specialized glass fibers may also be utilized in accordance with the embodiments of the present invention, depending on such parameters as, e.g., the output wavelength(s) of the LED die sources.

In addition, as would be apparent to one of ordinary skill given the present description, other waveguide types, such as planar waveguides, polymer waveguides, or the like, may also be utilized in accordance with the present teachings.

Optical fibers 122 may further include fiber lenses on each of the output ends of the optical fibers. Similarly, the light receiving ends of the optical fibers may each further comprise a fiber lens. Fiber lens manufacture and implementation is described in commonly owned and co-pending U.S. Pat. No. 6,882,190 and U.S. patent application Ser. No. 10/670,630, incorporated by reference herein.

One particular embodiment of the present invention, illustrated in FIG. 13, described in further detail below, is the implementation of an LED driven automotive headlamp using flexible TECS™ fiber to interconnect the light source and the headlamps. An aspect of this embodiment is the efficient coupling of the LED light into the TECS™ fiber in a way that produces the required luminance and beam pattern with a reduced number of LED sources.

Figure 2:
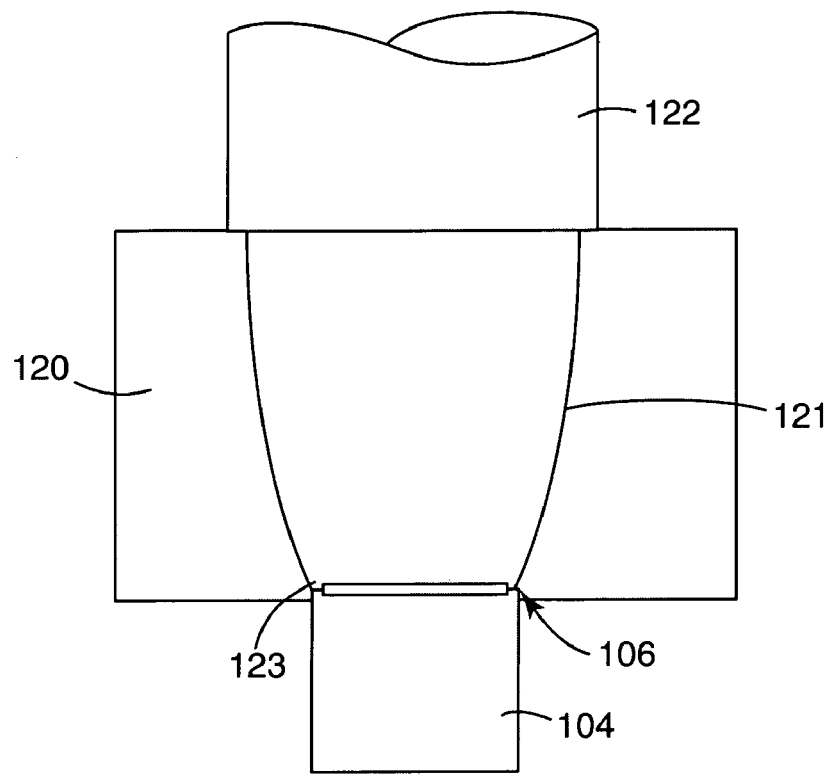
FIG. 2 is a simplified cross-sectional side view of a light source used in an illumination system in accordance with an embodiment of the present invention.

As illustrated in FIG. 2, a shaped reflector 120 may be added to each LED die 104 to redirect light from the LED die 104 into a corresponding fiber 122, which can have an exemplary core diameter of about 600 μm to 650 μm. In an exemplary embodiment, the structure of each reflector provides non-imaging light collection and distribution of the illumination to the light receiving fibers. The shaped reflectors 120 may be made of a multilayer optical film (MOF), such as Enhanced Specular Reflector (ESR) film available from 3M Company, St. Paul, Minn. Examples of MOFs are generally described in detail in U.S. Pat. Nos. 5,882,774 and 5,808,794, incorporated by reference herein in their entirety.

Alternatively, reflectors 120 may be formed in the appropriate shape in a metallic or plastic substrate or sheeting and coated with a reflective material, such as silver, aluminum, or reflective multilayer stacks of inorganic thin films. For example, an injection molded plastic film or sheeting may be formed. The reflector cavities formed therein may be coated with a suitable reflecting material. As described herein, the array of reflectors can be oriented beneath, around, or above the LED dies. In addition, the reflector cavity may be filled with an index matching material.

Referring back to FIG. 1, the individual fibers 122 are collected together to provide remote lighting at a distance from the original light sources. In a particular embodiment, the fibers 122 are brought together into a tight bundle in an output connector 130 that would replace, e.g., the bulb or bulb filament in a spotlight or headlight assembly. A further description of an LED-based lighting assembly that is implanted as a bulb replacement is described in a commonly pending and co-owned U.S. Patent Application Publication 2005/0140270, incorporated by reference above.

Referring back to FIG. 2, in an exemplary embodiment, a bare blue or UV LED die can be utilized. In some exemplary embodiments, the LED die can be coated, preferably on a light-emitting surface, with a phosphor layer 106, such as YAG:Ce phosphor. The phosphor layer 106 can be used to convert the blue output of the LED die into "white" light.

In an alternative embodiment, a collection of red, blue, and green LED dies can be selectively placed in an array. The resulting emission is collected by the array of fibers 122 so that the light emitted from the output ends of the fibers is seen by an observer as colored light or "white" light, when blended together in concert.

Figure 15:
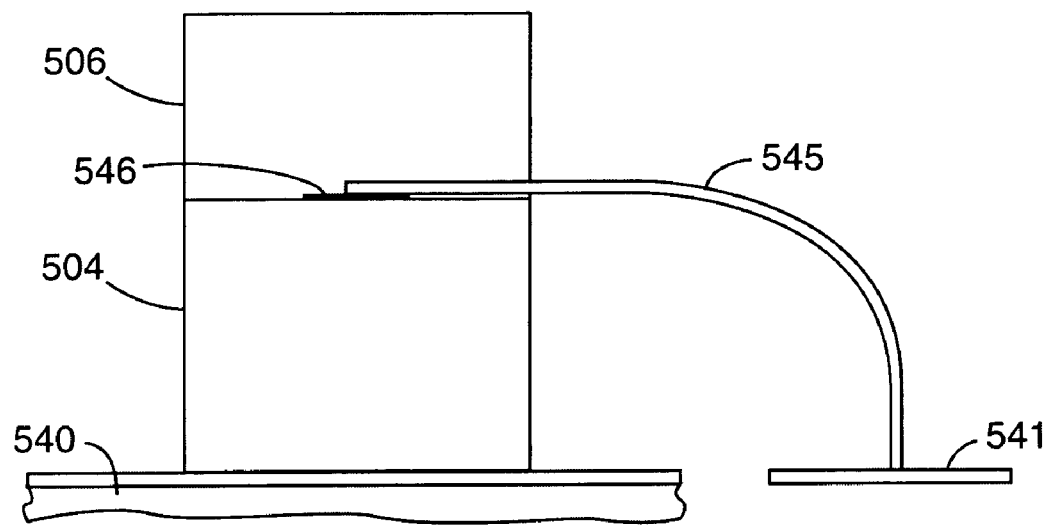
FIGS. 15 and 16 are example constructions of a phosphor encapsulated LED die.

As shown in FIG. 2, the phosphor layer can be mounted or formed on an emitting surface of an LED die. In an exemplary embodiment of the present invention, as shown in FIG. 15, the phosphor layer 506 can be precisely defined in order to substantially preserve, or reduce the degradation of the étendue of the LED die surface emission. By "substantially preserve" it is meant that the étendue of the LED die is maintained or is increased by a factor of two or less.

As shown in FIG. 15, a phosphor layer 506 is formed on LED die 504, which is surface mounted on substrate 540. In one example, the LED die 504 is a blue or UV surface emitting LED. The substrate 540 provides a conductive surface for the LED die cathode and anode access. For example, one or more wirebonds 545 can be coupled from an electrical contact surface 541 of the substrate to one or more bond pads 546 disposed on the top surface of LED die 504. Alternatively, a wirebond 545 may not be required to be bonded to the top surface of the LED die.

The phosphor layer 506 is disposed on or near an area of the LED die substantially corresponding to its emission surface.

It is understood that LED dies typically emit radiation through more than one surface. Layer 506 can be formed to a substantially uniform thickness (for example, about 75 μm to about 150 μm) and cured (partially or fully). In this exemplary embodiment, the layer 506 can then be converted into a shape or shapes by ablation, die cutting or other suitable techniques with minimal surface deformation to match the shape of the LED die emission surface. Alternatively, undersizing or oversizing layer 506, or forming a shape different from the shape of the LED die emission surface, may be utilized. When utilizing an array of LED dies, the phosphor layer may be formed directly on the surface of each LED die or, alternatively, the phosphor layer can be part of a separate, coated film of selectively patterned phosphor that is applied at or near the surfaces of an array of LED dies. Additional phosphor orientation is discussed further below and in a commonly pending and co-owned U.S. Patent Application Publication 2005/0116635, incorporated by reference above.

In an exemplary embodiment, phosphor layer 506 is formed as a phosphor-loaded encapsulant. For example, a YAG:Ce phosphor and a UV cure epoxy (such as a Norland NOA81 UV cure epoxy) can be utilized. The phosphor-loaded encapsulant can be partially or fully cured. In a partially cured state, the phosphor encapsulant will flow around the wirebond, encapsulating the wirebond and adhering both the phosphor and the wirebond to the surface of the die. If a hydrophobic encapsulant material is used, the reliability of the electrical interconnect can be improved. The phosphor encapsulant can be a low modulus material to minimize adverse effects due to the rising/falling temperature of the LED die. Here, the coefficient of thermal expansion (CTE) mismatch between the LED die material and the phosphor material can be compensated by such a deformable encapsulant.

If the phosphor encapsulant is fully cured, an additional adhesive layer (having about the same thickness as the wirebond) can be disposed on the surface of the LED die. For example, the additional adhesive layer can be formed on the LED die surface by deposition or dip-coating techniques. Thus, the additional adhesive layer can be utilized to encapsulate the wirebond and the phosphor encapsulant can be placed in void-free contact (via the adhesive) with the surface of the LED die.

The above well-defined phosphor layer construction can be used to substantially preserve the étendue of the light emitting surface of the LED die. In this example, the area of the phosphor layer is formed to be about the same as the area of the light-emitting surface. In addition, the thickness of the phosphor layer can be controlled to a suitable amount because as the phosphor layer has an increased thickness, the amount of light emitted from the sides of the phosphor layer will increase. In addition, color temperature and color uniformity parameters can be used to determine proper phosphor layer thickness for particular applications.

Figure 16:
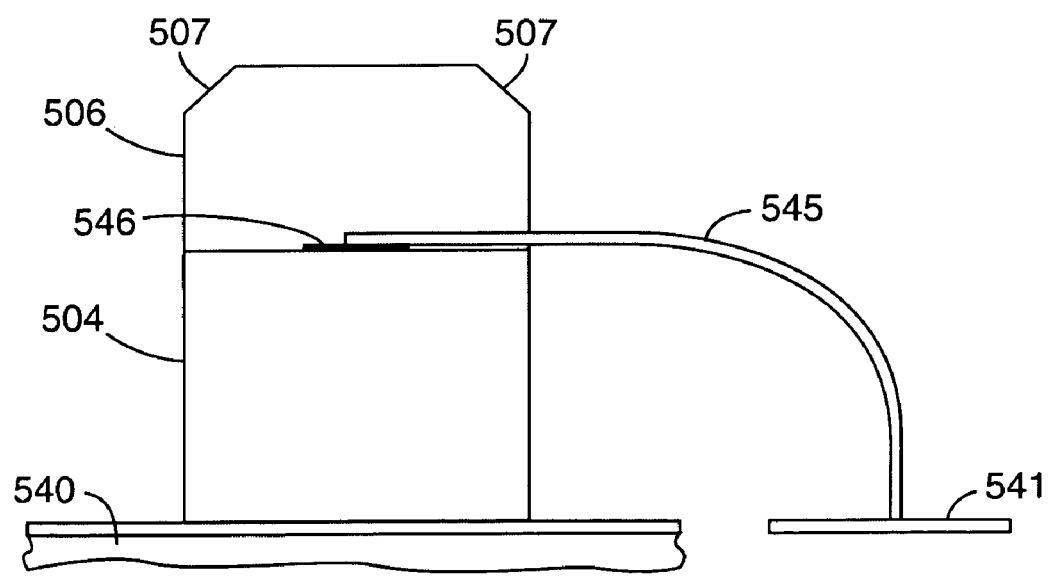

In an alternative embodiment, shown in FIG. 16, the shape of the phosphor layer can be further defined to substantially preserve the étendue of the LED die source. Here, LED die 504 is coupled to substrate 540, including contact surface 541, via wirebond 545. A phosphor layer 506 is formed on the light-emitting surface of LED die 504 as is described above. In addition, further ablation or dicing techniques may be used to form angled surfaces 507 on the phosphor layer 506.

Referring back to FIG. 2, a reflector 120 can be used to couple light emitted from the LED die 104 into fiber 122. Also, as shown in FIG. 2, the reflector can be formed so that it can slide over the LED die, so that its lower opening 123 provides a close fit around the perimeter of the LED die 104. Alternative reflector designs include the additional use of a reflective coating on the substrate on which the LED die is supported. Other reflector designs are described in detail in the commonly owned and co-pending U.S. Patent Application Publication 2005/0117366, filed concurrently, and incorporated by reference above.

An important aspect of this optical system is the shape of the reflective surface 121 of reflector 120. The reflector 120 can be formed by injection molding, transfer molding, microreplication, stamping, punching or thermoforming. The substrate in which the reflector 120 can be formed (singularly or as part of an array of reflectors) can include a variety of materials such as metal, thermoplastic material, or MOF. The substrate material used to form the reflector 120 can be coated with a reflective coating or simply polished in order to increase its reflectivity.

The shape of the reflector surface 121 is designed to convert the isotropic emission from the LED die, including a phosphor-coated LED die, into a beam that will meet the acceptance angle criteria of the light receiving fiber, e.g., a TECS™ fiber, thus preserving the power density of the light emitted from the LED dies. Once the light emitted by the LED die is collected and redirected by the reflector into the light receiving fiber, the fiber(s) can be used to transport the light to a distant location with low optical loss by total internal reflection. However, the light receiving fibers do not only serve to transport light. In addition, in accordance with embodiments of the present invention, by translating the fibers from the wider spacing of the LED die array to a tighter spacing or spacings, such as a tight packed fiber bundle, light from the widely dispersed LED array can be effectively concentrated into a very small area. Also, the optical design of the exemplary TECS™ fiber core and cladding provide for shaping the light beams emerging from the bundled ends, due to the Numerical Aperture (NA) of the fibers at the input end as well as the output end. As described herein, the light receiving fibers perform light concentrating and beam shaping, as well as light transportation.

The étendue, $\epsilon$, may be calculated using the formula $$\epsilon = A*\Omega \approx \pi*A*\sin^2\theta = \pi*A*NA^2$$

where $\Omega$ is the solid angle of emission or acceptance (in steradians);

A is the area of the receiver or emitter, $\theta$ is the emission or acceptance angle, and NA is the Numerical Aperture.

For example, assuming an NA of 0.48 and a 600 micrometer (μm) diameter fiber core, the étendue that can be received and transmitted by the fiber is about 0.2 mm steradians (sr). It is also assumed that a maximum emission surface of an exemplary LED die is about 300 μm×300 μm (or 90000 μm²) and that, in example implementations with the phosphor, the LED die has a nearly isotropic or Lambertian intensity distribution. Assuming a half-angle of 80 degrees, the étendue of the LED die is about 0.28 mm sr. Thus, while not all the light from the LED die may be collected by the fiber, a very large percentage of light (50% or greater) can be collected and transmitted by the light receiving fiber utilizing the reflector surface design and orientation described herein.

As mentioned above, in an exemplary embodiment where a phosphor layer is used to convert the light output to "white" light, the phosphor layer size and/or thickness can be limited in order to preserve the étendue of the emitting surface of the LED die.

Improving or optimizing the reflector shape can increase or even maximize the light transfer into the fiber. The general geometry for optimizing the reflector shape for a distributed light source with nearly Lambertian emission is shown in FIG. 3, which is a detail of the reflector surface 121 from FIG. 2 with angle and coordinate axis nomenclature added.

Figure 3:
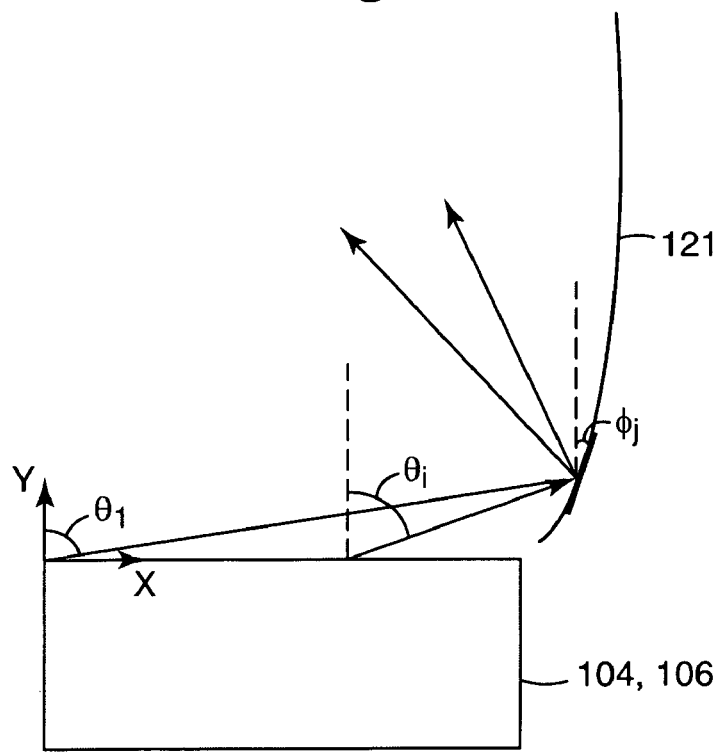
FIG. 3 is a detail view of a portion of the light source and reflector surface in accordance with an embodiment of the present invention.

The general geometry in FIG. 3 shows that for a given point on the mirror surface the light from the LED die strikes the mirror surface at an arrival angle $\theta_i$. Further, this point on the mirror is located at (x,y) and at this point the mirror makes an angle of $\phi_j$ relative to the vertical. The reflected beam from the mirror surface can then be shown to be at an angle of $\theta_i - 2\phi_j$ = entrance angle relative to the vertical which will be the entrance angle into the fiber.

The lighting constraints as imposed by the fiber and the LED in this example are:

1. LED/phosphor source size: 300 micrometer diameter
2. LED/phosphor emission angles: +/−80°
3. TECS ™ fiber size: 600 micrometer core diameter
4. TECS ™ fiber acceptance angle: NA 0.48 = entrance angle +/−28.7°

Some assumptions may be made to simplify the analysis at some expense of generality.

Limitations of the following analysis are:

The full source size is not considered, as it is rectangular, not circular as in this model—the actual source size is a square 300 micrometers by 300 micrometers.

The high angle light emitted from the part of the LED die nearest the reflector is neglected.

The analysis assumptions are:

Light is reflected into (or directly enters) the fiber at an angle less than the acceptance angle of ±28.7°. Thus the constraint on the reflected beam is that $|\theta_i - 2\phi_j| \leq 28.7°$.

The light emission angle from the LED/phosphor is nearly isotropic and so may vary from 0° to 80° half-angle from the vertical. The 80° maximum angle is used to establish the (x,y) coordinates of the first analysis point.

Emission angles less than 28.7° are presumed to directly enter the fiber.

The configuration is rotationally symmetric (see Limitations above).

For the analysis, the lowest point on the reflector curve is assumed to be at an incident angle controlled by the maximum angle of emission $\theta_1 = 90 - 80 = 10°$. This assumption then defines, for a value of x, the y or location of the reflector with orientation $\phi_j$. For example, if the reflector is assumed to start 30 micrometers to the right of the LED 104 in FIG. 2, the (x, y) location of the first point on the reflector is calculated to be 330*tan(90−80) or 58 micrometers.

Once the y location of the reflector point is known, the minimum angle to the nearest point on the LED/phosphor can be calculated as $$\tan^{-1}\left(\frac{y}{(x-300)}\right)$$

assuming the x coordinate system starts at the furthest edge of the (assumed round, in this example) LED, 300 micrometers away. For the reflection point at y=58 micrometers, the minimum emission angle is 27.3°.

With the minimum and maximum emission angles $\theta_i$ calculated, the maximum and minimum reflector angle $\phi_j$ can be calculated such that the reflected ray would enter the fiber using Equation 1 and the first constraint above. Continuing the example, the reflector angle can be between about 0.7° and about 25.7°.

The reflector shape then may be numerically estimated by repeating this calculation for various angles less than the maximum of 80 degrees. In Table 1, the angle is decreased by one degree increments to the acceptance angle of the fiber, about 29°.

With the array of (x, y) values for the reflector, the incremental reflector angle generated by this approach can then be estimated from the local derivative (difference) of the two (x, y) pairs nearest the selected (x, y) point. In the example for the maximum 80° angle, the initial reflector angle is 17.5°.

From the plot, the polynomial regression fit for the curve generated by this approach is $y = 5E-06x^4 - 0.0068x^3 + 3.6183x^2 - 859.5x + 76443$ ($R^2 = 1.0$) where, as shown in FIG. 3, the coordinate system origin is at the left edge of the (assumed round) LED.

Figure 4:
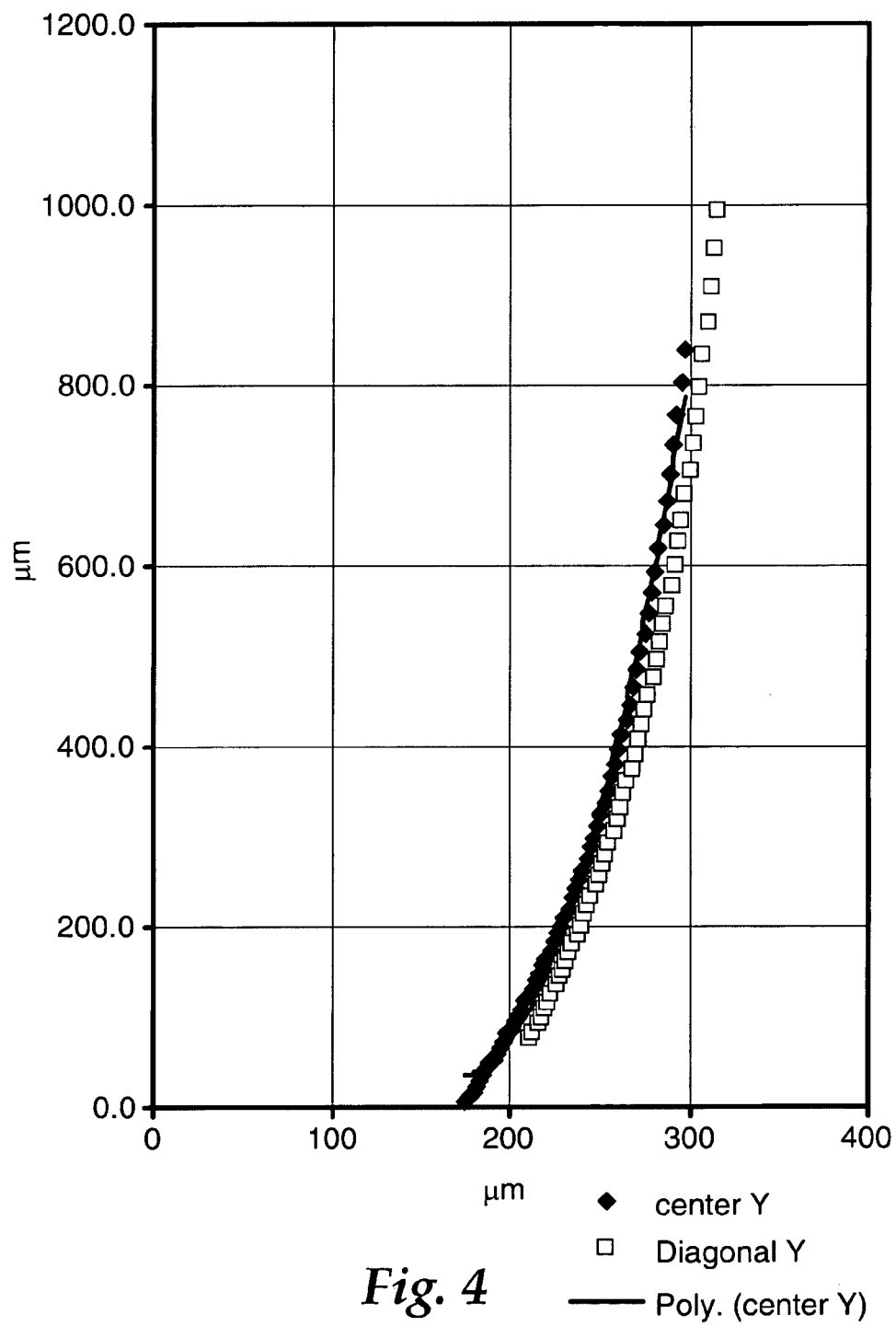
FIG. 4 is a graph representing the curve shape plot of reflector points assuming an 80 degree maximum emission angle and a 30 micrometer separation between the LED die and the reflector.

Table 1 below shows example calculations for a maximum emission angle of 80 degrees and a separation of 30 micrometers from the edge of the LED to the edge of the reflector. From Table 1, the calculated $\phi_j$ values for the actual curve are calculated in the last column of the table below. These values are coded in bold if the actual reflector will reflect the LED light into the fiber and in italics if some of the LED light will be reflected outside the acceptance angle of the fiber. The calculations show that with the exception of the top of the mirror surface, the emitted light can be reflected into the fiber. FIG. 4 is a plot of the curve shape of reflector points as outlined in the text assuming an 80 degree maximum emission angle and a 30 micrometer separation between the LED and the reflector. This figure shows three representations based the circular die model. The center Y plot represents the minimum inscribed circle from the center of the LED die to a nearest edge, the diagonal Y represents the maximum circumscribed circle from the center of the die to a corner, and the polynomial (center Y) is a polynomial fit of the center Y data. Note that while a $4^{th}$ order polynomial is an exact fit, a $2^{nd}$ order polynomial has a $R^2 = 0.997$.

At least one method to make the upper portion of the mirror surface also reflect light into the fiber would be to make the curve piecewise discontinuous, for example, making the upper 400 micrometers portion simply vertical ($\phi_j = 0$).

TABLE 1

| Max angle | x | y | min angle | $\phi$ min | $\phi$ max | $\phi_j$ |
|---|---|---|---|---|---|---|
| 80 | 330 | 58.2 | 27.3 | −0.7 | 25.7 | 17.5 |
| 79 | 332 | 64.5 | 26.4 | −1.2 | 25.2 | 17.2 |
| 78 | 334 | 71.0 | 25.6 | −1.5 | 24.7 | 16.9 |
| 77 | 336 | 77.6 | 24.9 | −1.9 | 24.2 | 16.6 |
| 76 | 338 | 84.3 | 24.3 | −2.2 | 23.7 | 16.3 |
| 75 | 340 | 91.1 | 23.7 | −2.5 | 23.2 | 16.0 |
| 74 | 342 | 98.1 | 23.2 | −2.8 | 22.7 | 15.7 |
| 73 | 344 | 105.2 | 22.7 | −3.0 | 22.2 | 15.4 |
| 72 | 346 | 112.4 | 22.3 | −3.2 | 21.7 | 15.1 |
| 71 | 348 | 119.8 | 21.8 | −3.4 | 21.2 | 14.8 |
| 70 | 350 | 127.4 | 21.4 | −3.6 | 20.7 | 14.5 |
| 69 | 352 | 135.1 | 21.0 | −3.8 | 20.2 | 14.2 |
| 68 | 354 | 143.0 | 20.7 | −4.0 | 19.7 | 13.9 |
| 67 | 356 | 151.1 | 20.3 | −4.2 | 19.2 | 13.6 |
| 66 | 358 | 159.4 | 20.0 | −4.3 | 18.7 | 13.3 |
| 65 | 360 | 167.9 | 19.7 | −4.5 | 18.2 | 13.0 |
| 64 | 362 | 176.6 | 19.3 | −4.7 | 17.7 | 12.7 |
| 63 | 364 | 185.5 | 19.0 | −4.8 | 17.2 | 12.3 |

TABLE 1-continued

| Max angle | x | y | min angle | φ min | φ max | φ$_j$ |
|---|---|---|---|---|---|---|
| 62 | 366 | 194.6 | 18.7 | −5.0 | 16.7 | 12.0 |
| 61 | 368 | 204.0 | 18.4 | −5.1 | 16.2 | 11.7 |
| 60 | 370 | 213.6 | 18.1 | −5.3 | 15.7 | 11.4 |
| 59 | 372 | 223.5 | 17.9 | −5.4 | 15.2 | 11.1 |
| 58 | 374 | 233.7 | 17.6 | −5.6 | 14.7 | 10.8 |
| 57 | 376 | 244.2 | 17.3 | −5.7 | 14.2 | 10.5 |
| 56 | 378 | 255.0 | 17.0 | −5.8 | 13.7 | 10.2 |
| 55 | 380 | 266.1 | 16.7 | −6.0 | 13.2 | 9.9 |
| 54 | 382 | 277.5 | 16.5 | −6.1 | 12.7 | 9.6 |
| 53 | 384 | 289.4 | 16.2 | −6.2 | 12.2 | 9.3 |
| 52 | 386 | 301.6 | 15.9 | −6.4 | 11.7 | 9.0 |
| 51 | 388 | 314.2 | 15.6 | −6.5 | 11.2 | 8.7 |
| 50 | 390 | 327.2 | 15.4 | −6.7 | 10.7 | 8.4 |
| 49 | 392 | 340.8 | 15.1 | −6.8 | 10.2 | 8.1 |
| 48 | 394 | 354.8 | 14.8 | −6.9 | 9.7 | 7.8 |
| 47 | 396 | 369.3 | 14.6 | −7.1 | 9.2 | 7.6 |
| 46 | 398 | 384.3 | 14.3 | −7.2 | 8.7 | 7.3 |
| 45 | 400 | 400.0 | 14.0 | −7.3 | 8.2 | 7.0 |
| 44 | 402 | 416.3 | 13.8 | −7.5 | 7.7 | 6.7 |
| 43 | 404 | 433.2 | 13.5 | −7.6 | 7.2 | 6.5 |
| 42 | 406 | 450.9 | 13.2 | −7.7 | 6.7 | 6.2 |
| 41 | 408 | 469.4 | 13.0 | −7.9 | 6.2 | 5.9 |
| 40 | 410 | 488.6 | 12.7 | −8.0 | 5.7 | 5.7 |
| 39 | 412 | 508.8 | 12.4 | −8.1 | 5.2 | 5.4 |
| 38 | 414 | 529.9 | 12.1 | −8.3 | 4.7 | 5.2 |
| 37 | 416 | 552.1 | 11.9 | −8.4 | 4.2 | 4.9 |
| 36 | 418 | 575.3 | 11.6 | −8.5 | 3.7 | 4.7 |
| 35 | 420 | 599.8 | 11.3 | −8.7 | 3.2 | 4.4 |
| 34 | 422 | 625.6 | 11.0 | −8.8 | 2.7 | 4.2 |
| 33 | 424 | 652.9 | 10.8 | −9.0 | 2.2 | 4.0 |
| 32 | 426 | 681.7 | 10.5 | −9.1 | 1.7 | 3.7 |
| 31 | 428 | 712.3 | 10.2 | −9.2 | 1.2 | 3.5 |
| 30 | 430 | 744.8 | 9.9 | −9.4 | 0.7 | 3.3 |
| 29 | 432 | 779.3 | 9.6 | −9.5 | 0.2 | 3.1 |
| 28 | 434 | 816.2 | 9.3 | −9.7 | −0.3 | |

Figure 7:
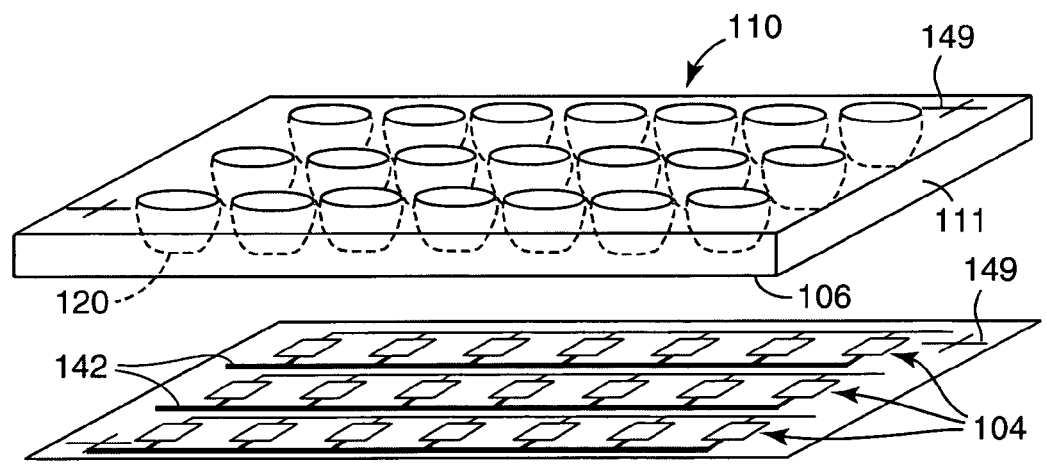
FIG. 7 is a partially exploded view of an array of interconnected LED dies and an array of optical concentrating elements used in an illumination system in accordance with an embodiment of the present invention.

The above reflector designs can be implemented in an array pattern in a number of different implementations. For example, FIG. 7 shows an example array of LED die sources 104, coupled to electrical interconnect means 142, which can be disposed on a circuit layer 141 (such as flexible circuits or semi-additive flexible circuits, including 3M™ Flexible (or Flex) Circuits, available from 3M Company), which can be disposed on a substrate. The LED dies 104 can be surface mounted to layer 141 or, in one alternative, recessed into receiving apertures formed in the flexible circuit layer. As an alternative to the wirebonding connections discussed above, an alternative electrical interconnection of the LED array is made possible when utilizing flexible circuitry. For example, cantilevered leads can be formed by chemical removal of the dielectric, e.g. polyimide. This process can leaves one (or two) lead(s) cantilevered for ultrasonic or wire bonding to the electrical contact on the LED die. Such cantilevered interconnect leads may be smaller than wirebond wires and are substantially flat.

As mentioned above, phosphor elements 106 can be utilized to convert the output wavelength of the light from the LED die emission spectrum to the desired illumination spectrum. Also, a corresponding array of reflectors 120 can be utilized, forming an array 110 of passive optical elements, which can be formed in a microreplicated reflector sheeting 111, to efficiently couple light from the LED dies to a matching array of optical fibers 122, such as those shown in FIG. 1. The reflector sheeting may comprise a MOF (such as that available from 3M company), with open reflector cavities formed therein. Alternatively, sheet 111 can comprise reflectors 120 made from an injection molded material with reflective coatings (e.g., silver, aluminum, gold, inorganic dielectric stacks, or the like) disposed or coated on the inner walls (such as surface 121 from FIG. 2). Alternatively, reflectors 120 can be formed using an embossed or punched metal sheet of reflector shapes.

In addition, phosphor layer 106, such as those described previously, can be selectively patterned by incorporating a pattern of phosphor material onto the top or bottom of the array layer 110. While FIG. 7 shows a square LED die array, a regular or irregular array of LED light sources with associated optical elements, electrical interconnect, phosphor elements and reflective shapes could be used depending on application requirements. In addition, with this exemplary design, fiducial marks 149 can be used to align the respective array layers. An example multilayer construction for a multiple LED die source is described below with reference to FIG. 14.

Figure 5:
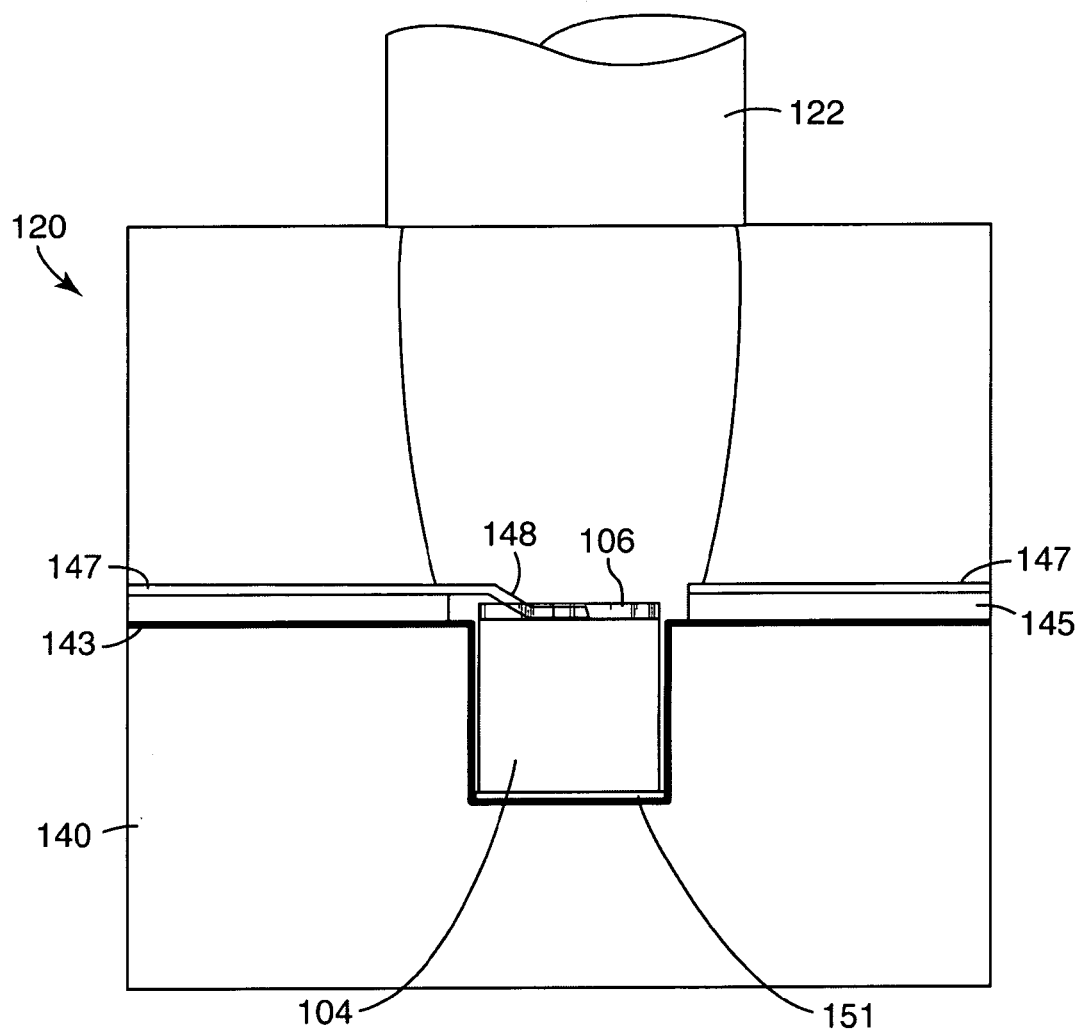
FIG. 5 is a cross-sectional side view of an embodiment of a light concentrating element in accordance with an embodiment of the present invention.

FIG. 5 shows an example mounting structure or substrate 140 for the LED die 104. Substrate 140 can provide a low resistance thermal path to conduct heat away from the LED die 104. In this exemplary embodiment, LED die 104 is disposed in a well 151, where the bare LED die 104 can be attached to the substrate 140 by a conventional attachment, such as by using a solder or metal (e.g., Au—Sn) reflow die attachment. The substrate 140 can also support a circuit layer. In this exemplary embodiment, the substrate 140 can be coated with a reflective coating 143. In addition, as shown in FIG. 5, a cantilevered lead 148 is bonded onto the LED die from the interconnect circuit layer.

In FIG. 5, the phosphor material 106 can be located in the bottom of the reflector, coated on a sheet laminated to the bottom of the reflector, selectively patterned on a sheet laminated to the bottom of the reflector or, in a preferred method, deposited on top of the LED die.

In an exemplary embodiment, an interconnect circuit layer, rigid or flexible, can be utilized to provide interconnection. As described herein, flexible circuit materials are available from the 3M Company. In the example shown in FIG. 5, a dielectric (e.g., polyimide) portion 145 of the flexible circuit layer can be disposed on reflective coating 143. In addition, a conductive portion 147 of the flexible circuit layer, such as a copper conductor and/or other metallization (e.g., Ni/Au) can be disposed on polyimide portion 145 for interconnection.

Alternatively, the flexible circuit layer can be inverted, and the bare LED die can reside in a recessed portion of the polyimide surface, directly on the metal/circuit layer 147. In this alternative implementation, wells need not be formed in the substrate material 140. An electrically insulating material with good thermal conductivity may be disposed between the conductive portion of the flexible circuit and substrate, depending on the die electrical attachment requirements. Example implementations of interconnect circuitry are described in a concurrently pending and co-owned U.S. Patent Application Publication 2005/0116235, incorporated by reference above.

A potentially lower performance, but perhaps lower cost alternative embodiment, can include a conventional FR4 epoxy based printed wiring board structure for electrical interconnect. In yet another embodiment, a low cost circuit can be prepared by patterning conductive epoxy or conductive ink onto a suitable substrate as required to connect the LED die array.

Figure 6A:
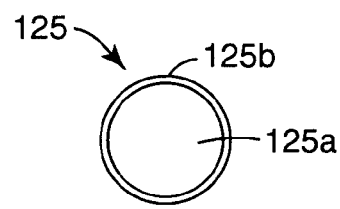
FIG. 6a shows an example single light receiving fiber and FIG. 6b shows an example bundle of light receiving fibers.
Figure 6B:
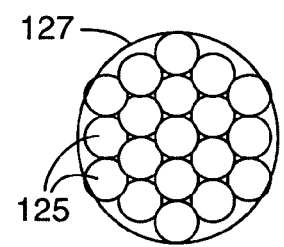

As mentioned above, a one-to-one fiber to LED die correspondence can provide for better illumination efficiency. As an illustration of this principle, FIG. 6a shows a single fiber 125, with a core 125a and a cladding 125b. FIG. 6b shows a bundle 127 of nineteen fibers 125. For example, the effective area of a beam of light that is needed to illuminate bundle 127 is about 0.0017 square inches (0.011 square centimeters), for fibers 125 having an outer diameter of 0.028 inches each, with a core diameter of about 650 micrometers. The area of the nineteen light transmitting fiber cores 127 is about 0.0010 square inches (0.0065 square centimeters). With an assumed uniformly distributed light source, the amount of light coupled into a waveguide is proportional to the input area of the waveguide; therefore, the efficiency ratio of light coupling in this figure is 0.0010/0.0017, or about 60%.

An advantage of the present invention is an efficient launch of light into individual fibers of a fiber bundle. If using a single source, for example, efficiency can drop significantly due to uncontrolled light launch angles and to light coupling into the fiber cladding and the interstitial spaces between the fibers in the bundle. Thus, traditional systems, which do not mate an individual LED to a corresponding fiber, may lose 25 to 40% of the emitted light due to the dark spaces between the fibers in the bundle. Such systems would then require tight bundling of more fibers and would still yield a less concentrated light.

In contrast, in the present invention, the light receiving fibers can then be brought down into a very tight output array based on the diameter of the fibers, which thus yields a very compact, concentrated emission of light.

Because the individual light receiving fibers of the present invention are relatively small in diameter they may be routed and bent as a bundle, and the bundle may have a cross section of various geometric shapes, such as circular, helical, rectangular, or other polygonal shapes. Exemplary embodiments of the present invention allow a remotely powered source to be concentrated and redirected to places where lighting power is not normally obtainable in an efficient manner.

Figure 13:
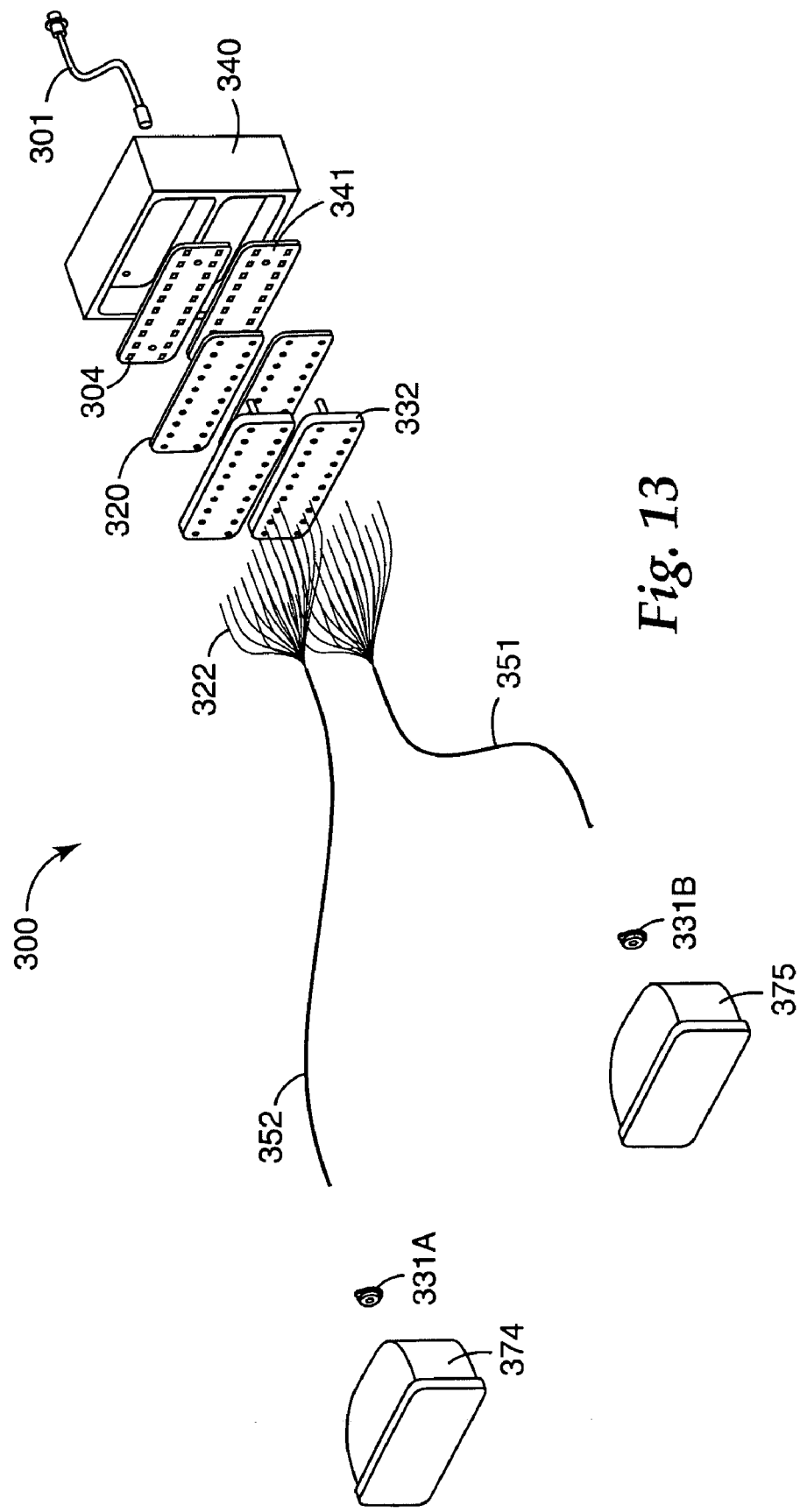
FIG. 13 is an exploded perspective view of a vehicle illumination system in accordance with an embodiment of the present invention.

For example, in the application of vehicle headlights, such as that illustrated in FIG. 13, the invention provides a highly concentrated light source that is similar in size and shape to a lamp filament, so the emitted light can be shaped and projected by a reflective surface or refractive element. FIG. 13 shows an embodiment of a remote lighting system 300 for a motor vehicle that includes a coupler 301 to couple the vehicular power source (not shown) to an array of LED dies 304. The LED dies 304 can be surface mounted on an interconnect circuit layer 341 that can be disposed on a substrate 340, made from a thermally conductive material, such as described above. In this embodiment, an array of reflector shapes 320 can be disposed, such as by bonding, on the interconnect circuit layer so that each bare die is surrounded on its perimeter by a reflective surface. Light emitted from the LED dies and collected/concentrated by the array of reflectors can optionally be directed towards an array of lenses 312, which can focus the emitted light into the input ends of corresponding fibers 322.

As shown in FIG. 13, an input connector 332 can be utilized to hold the input ends of fibers 322. In this exemplary embodiment, the individual fibers can be bundled into two sets of fibers 351 and 352, so that the light can be output at different locations (e.g., left and right vehicle headlights 374 and 375). Output connectors 331A and 331B can be utilized to hold the bundled sets of fibers in their respective headlights. In this manner, a "cool" headlight can be utilized, as the heat source (i.e., the light generating source—LED die array) is remote from the eventual illumination output area. This arrangement can reduce heat damage to optical elements located in the headlight, such as reflectors, coatings, lenses, and other associated optics.

In another exemplary embodiment, the illumination system, such as system 300 shown in FIG. 13, can further include an infrared sensor. In this alternative embodiment, one or more of the array of LED dies can comprise an infrared emitting LED die. Such infrared LED dies can be conventional IR LED dies, such as those available from Honeywell. The system can further include a conventional IR detector to receive an IR signal. This alternative embodiment can be utilized for collision detection applications. In addition, other types of sensors, for example, ambient light sensors, can be employed for automatic dimming applications and/or for turning lights on automatically at dusk. Thus, in this alternative embodiment, the illumination system of the present invention can provide both illumination and telemetry. Alternatively, an infrared transceiver device can be included, constructed as an integral part of, or separate from, the illumination system.

FIGS. 8-11 illustrate various exemplary connector embodiments that can provide low cost construction and that can be utilized in the illumination systems and assemblies described herein.

Figure 8:
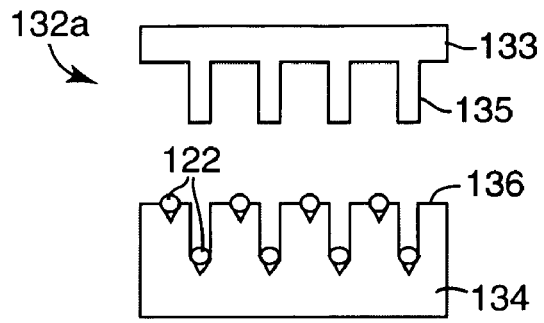
FIGS. 8-11 are cross-sectional end views of alternative embodiments of an optical connector used in an illumination system in accordance with the present invention.

FIG. 8 illustrates a design for an input connector 132a that facilitates top or bottom loading of fibers 122 and allows for an n×n array of fibers at a determined pitch that would correspond with the array of light sources on the input end of the fiber cable assembly. In this exemplary embodiment, the connector 132a is formed from a two piece construction, with a top portion 133 having teeth 135 designed to engage fibers 122 in bottom piece 134. The bottom connector portion 134 can include grooves 136 that receive fibers 122 and teeth 135 to provide a secure fit. This structure not only allows for low cost assembly, but also enables one to assemble a two-dimensional array in one step. Other two-dimensional connector designs can require "stacking" of layers of V-groove connectors.

Figure 9:
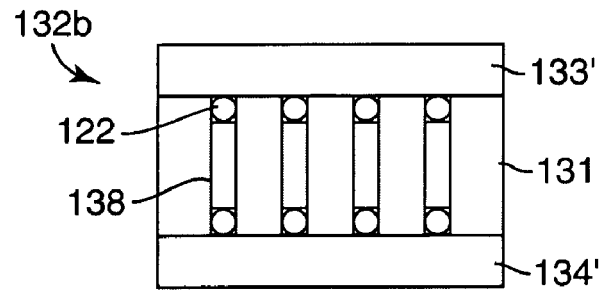

FIG. 9 illustrates an n×n array input connector 132b where fibers 122 could be installed from the top and the bottom. The connector 132b of this exemplary embodiment is formed from a three piece construction, where the connector includes a center portion 131 having fiber receiving grooves 138 that are enclosed by top portion 133' and bottom portion 134'. Alternatively, the connector 132b can be formed from a single integrated construction. This design also allows making the two-dimensional connector in one step. To accomplish this, the assembly machine in FIG. 12, for example, would have two fiber arrays instead of one wide, linear fiber array.

Figure 10:
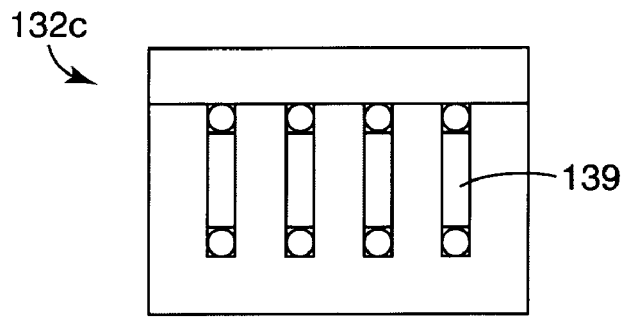

FIG. 10 illustrates a design for an input connector 132c with top or bottom loading, where spacers 139 are used to set the column pitch between fibers. This design also eliminates the need to stack v-groove layers, by inserting "spacers" to create the two-dimensional array.

Figure 11:
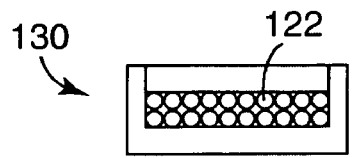

FIG. 11 illustrates a design for the output connector 130 for the fiber cable assembly. This design can be for top loading and can accommodate dense packing of the fibers 122 for providing a concentrated illumination source. Other connector designs can also be utilized as would be apparent to one of ordinary skill in the art given the present description.

Figure 12:
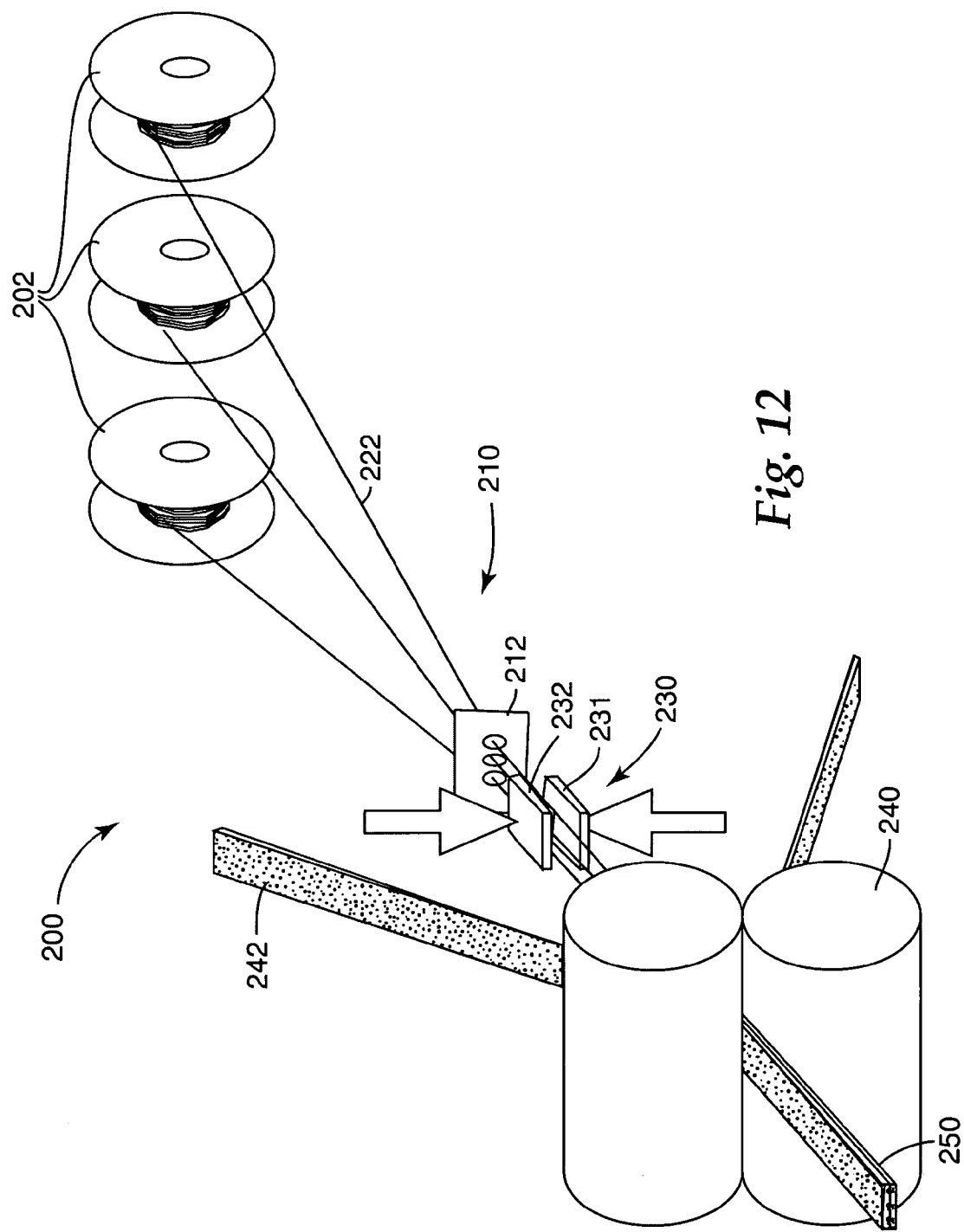
FIG. 12 is a simplified illustration of an assembling setup for the simultaneous manufacture and termination of cable assemblies.

FIG. 12 illustrates an automated assembly procedure that may be used to build these devices. This figure depicts a process for Inline Cable Assembly (INCA) that provides the capability to simultaneously manufacture and terminate cable assemblies. The INCA process is described, for example, in co-owned U.S. Pat. Nos. 5,574,817 and 5,611,017, the disclosures of which are hereby incorporated by reference. The INCA system 200 consists of an array of N fiber spools 202, with fibers feeding the INCA assembly machine 210. The fibers 222 are brought into an array with a particular, desired pitch using a precision spaced guide comb 212. Typically this pitch will be the pitch required to terminate a particular connector design. Once on pitch, the fibers are routed to a connector assembly station 230, where connector components, consisting of at least a connector bottom 231 and a connector cover 232, are moved into position above and below the fiber array. At predetermined intervals along the length of the fiber array, the connector bottom 231 and cover 232 will be brought together to further align and then capture the fibers of the array. The connector assembly can be mechanically or adhesively bonded to the fibers to create a terminated cable assembly, such as through the use of laminating rollers 240 and adhesive tape 242. If a single connector is assembled, the output of the machine will be connectorized pigtails (cable with a connector on one end). By installing two connectors in opposing positions, spaced slightly apart, connectorized jumper cables 250 (cable with connectors on both ends) will be output from the machine. From the point of connectorization, the assembled connector and fibers continue through the machine and a protective cable jacket is installed over the fiber array and connectors.

Figure 14:
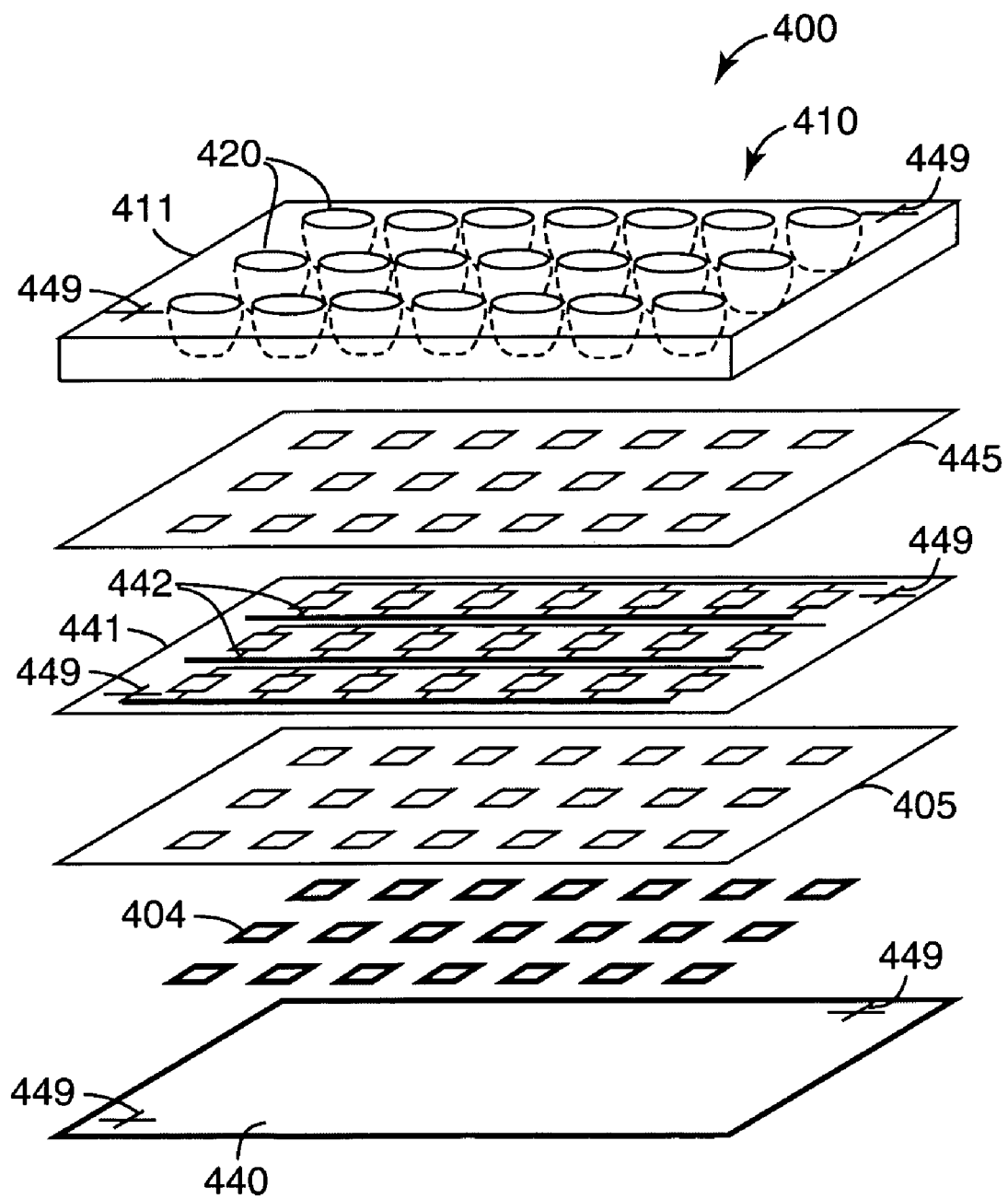
FIG. 14 is an example construction of a multilayer, high density solid state light source.

FIG. 14 shows an exploded view of an example construction of a multilayer, high-density solid state light source 400, that can be coupled to optical fibers to provide remote sourcing, consistent with the embodiments described above. A first layer, or substrate 440, is selected to provide a base for supporting an array of LED dies 404. As described above, substrate 440 can comprise a material with high thermal conductivity, such as copper, or the like. In addition, substrate 440 can be electrically conductive, and can provide a power or ground bus for the array of LED dies 404. The LED dies 404 can be bonded to substrate 440 using conventional techniques, including solder, adhesives, or the like. An adhesive layer 405 can then placed over the LED dies. The adhesive layer 405 can include a pattern of cut-outs corresponding to the position and pitch of the LED dies.

To provide electrical connections, a patterned flexible circuit layer 441 can then be placed over the patterned adhesive layer 405. The flexible circuit layer 441 includes an electrical conductor pattern 442 to provide contact to the LED dies 404. Typically, LED dies require two electrical connections—in some designs, one connection is on top of the LED die and one is on the bottom of the LED die and in other designs, both connections are on top. In this exemplary embodiment, flexible circuit layer 441 includes cut-outs corresponding to the array of LED dies. Top connections to the LED dies are made via the circuit patterns 442 on the flexible circuit layer 441 and bottom connections can be made through the substrate 440. Fiducial marks 449 can be utilized to ensure proper alignment between the substrate and flexible circuit layer 441.

An array of passive optical elements 410, such as reflectors 420 formed in a microreplicated reflector sheet 411 can be used to provide coupling of the light emitted from the LED dies to the corresponding array of optical waveguides. In this exemplary embodiment, sheet 411 includes an array of reflectors 420. The reflectors 420, consistent with the embodiments described above, can be formed in a multilayer optical film or, alternatively, they can comprise molded, machined, or embossed shapes formed from a reflective (e.g., plastic, metallic) sheet that is patterned at the same pitch as the LED dies. In addition, the reflectors can also include a lens shape within the reflector cavity. Further, patterned phosphors can be included in the reflector cavities, or bonded to the top or bottom of the sheet 411.

An additional patterned adhesive layer 445 can be used to attach array 410 to the flexible circuit layer 441. Again, fiducials 449 can be utilized for alignment. The adhesive material can be selected to provide high bond strength and/or insulation between the substrate and the array of reflectors. Further, the adhesive material can mitigate stresses due to any mismatch between the coefficient of thermal expansion (CTE) of the substrate and the reflector sheeting.

In an alternative embodiment, the position of the flexible circuit layer and the reflector array can be interchanged. For example, the flexible circuit layer leads can be routed through the reflector cavity to attach to the LED die bonding pads.

The illumination assemblies and systems described above have several advantages over prior systems. First, smaller LED dies, such as those described above, with lower heat outputs can be utilized without suffering loss in illumination intensity. In the examples discussed above, the LED dies in the array are physically separated to avoid thermal hot spots in the mounting structure. This structure allows the LED dies to be electrically driven harder, with more output illumination (and hence, a brighter output beam emitted from the output ends of the fibers). Tightly packing large numbers of LED die is a long term reliability concern since local heating, even with a globally efficient thermal conduction mechanism, can cause reduced LED lifetime and in extreme cases catastrophic failures. Spacing the LED dies farther apart than the width of the LED die allows reasonably thermally conductive substrates to extract the heat from the LED array without local hot spots. The LED dies may also be safely operated at higher currents and light outputs than stated in the normal operating specifications, if sufficient heat extraction is provided. Moreover, as compared to filament light sources, the LED die array of the present invention does not generate intense heating in the forward directed beam, which can be a result of filament heating. This intense heat can cause damage to polymer lenses and reflector assemblies that are sometimes employed in lighting elements, such as automobile headlights.

A second advantage is the one fiber per LED coupling. Prior systems coupled dense arrays of LEDs into a large diameter fiber or fiber bundle. Dense LED arrays have the previously mentioned reliability problems, but their implementation has been justified as providing the best efficiency for coupling light into the fiber (at the expense of reliability). Providing one fiber per LED source allows the LED dies to be physically separated, minimizing localized thermal effects from dense concentrations of LEDs as discussed above.

Another advantage is the electrical interconnect wiring. A thin (for example, 25 to 50 micrometer) layer of electrical wiring as exemplified by flexible circuitry, such as the flexible circuitry described previously, provides electrical interconnect, some thermal conduction of heat from the die, and a flat electrical interconnect structure which may be laminated. The resulting construction overall is a very thin layer, so that the optical performance of this layer is not critical. The thin, flat layer allows the entire array to be laminated into a highly reliable solid or nearly solid block of material with the LED array (on a substrate) bonded to the electrical interconnect layer, which can in turn be bonded to the reflector sheeting. The advantages of particular implementations of interconnect circuitry are described in the pending and co-owned U.S. Patent Application Publication 2005/0116235, incorporated by reference above.

An additional advantage of the illumination devices described herein is the lamination or encapsulation of the entire assembly. Since the LED array and the reflector cavities may be filled with a solid material, for example an epoxy or molded polycarbonate, the entire assembly may be laminated into a block with no voids. Voids in electrical equipment can be reliability issues in some applications because water tends to collect in polymer voids, leading to long-term reliability issues.

Also, a beam-forming reflector can be disposed in front of the LED die. Further, the reflector structure may be made from MOF, which can be drawn into the reflector shape while retaining reflectivity over the visible light wavelengths and over a wide range of incident angles.

Another advantage is the described phosphor placement that provides for a selected output color. Prior attempts utilize phosphor in the cavity holding the LED. This bulk phosphor deposition requires significant amounts of relatively expensive phosphor and, since the phosphor emits light isotropically, this inherently degrades the étendue of the LED source by making the LED appear larger than its actual size. This, in turn, can significantly reduce the coupling efficiency of the light into a fiber or other waveguide, as described in the embodiments above.

The phosphor 106, such as shown in FIG. 5, may be coated on a sheet and laminated into the structure at the bottom (or top) of the reflector, or be directly deposited on the surface of the LED. Using a coated layer of phosphor results in a very uniform, thin layer of phosphor in a binder that efficiently converts the LED energy into "white" light. The phosphor layer can be precisely defined so not to appreciably increase the apparent size of the LED source, thereby preserving the étendue of the LED and improving the coupling efficiency of the system. When depositing the phosphor-loaded epoxy directly or indirectly onto the emitting surface of the LED, the amount of phosphor can be reduced and the size of the LED emission area can be precisely maintained through precise volume deposition of very small volumes of phosphor.

Another advantage of the present invention is the ability to tailor the color spectrum emitted from the LED die array. While "white" light may be made from a combination of LED die colors, several exemplary embodiments utilize a phosphor layer to convert blue or UV radiation into a broad spectrum, i.e., "white" light. Using different phosphors across the LED die array can produce "white" light with a desired color temperature. Similarly, a variety of colors may be produced by tailoring the phosphor used across the LED dies.

While placing the phosphor-coated sheet on top of the reflector array may not result in the most efficient coupling of light energy into a fiber array (because of the limited acceptance angle of the optical fiber), such a construction might be advantageous for a large surface, high divergence array, again without localized hot spots from dense concentrations of LEDs.

While the present invention has been described with a reference to exemplary preferred embodiments, the invention may be embodied in other specific forms without departing from the scope of the invention. For example, while the present exemplary embodiments have been shown in the area of automotive headlights, the present illumination system may be used in aircraft, marine, medical, industrial, home, and even other automotive applications. Accordingly, it should be understood that the embodiments described and illustrated herein are only exemplary and should not be considered as limiting the scope of the present invention. Other variations and modifications may be made in accordance with the scope of the present invention.

We claim:

1. An illumination device, comprising:
   a first plurality of radiation generating sources to generate optical radiation;
   a first plurality of optical waveguides, wherein each of the plurality of optical waveguides includes a first end and a second end, wherein each first end is in optical communication with a corresponding radiation generating source of the first plurality of radiation generating sources;
   a second plurality of radiation generating sources;
   a second plurality of optical waveguides, each having first and second ends wherein each first end is in optical communication with a corresponding radiation generating source of the second plurality of radiation generating sources; and
   an array of optical elements, wherein each optical element of the array of optical elements is interposed between a corresponding first end of the first and second pluralities of optical waveguides and the corresponding radiation generating source.

2. The illumination device according to claim 1, wherein the first plurality and second plurality of waveguides comprise a first plurality and a second plurality of optical fibers, wherein the second ends of the second plurality of optical fibers are bundled with the second ends of the first plurality of optical fibers to form a single light illumination source when illuminated.

3. The illumination device according to claim 1, wherein the first and second pluralities of radiation generating sources have different emission spectra.

4. The illumination device according to claim 3, wherein the first plurality of radiation generating sources emits white light.

5. The illumination device according to claim 1, wherein the first plurality and second plurality of waveguides comprise a first plurality and a second plurality of optical fibers, wherein the second ends of the second plurality of optical fibers are bundled in a first bundle and wherein the second ends of the first plurality of optical fibers are bundled in a second bundle, and wherein a first direction of output emission from the first bundle is different from a second direction of output emission from the second bundle.

6. The illumination device according to claim 1, further comprising:
   a third plurality of radiation generating sources, and
   a third plurality of optical waveguides, each having first and second ends wherein each first end is in optical communication with a radiation generating source of the third plurality of radiation generating sources.

7. The illumination device according to claim 6, wherein the first plurality of radiation generating sources comprises red emitting LED dies, wherein the second plurality of radiation generating sources comprises blue emitting LED dies, and wherein the third plurality of radiation generating sources comprises green emitting LED dies.

8. The illumination device according to claim 7, wherein the first, second, and third pluralities of LED dies respectively emit red, blue, and green radiation in concert to generate a variety of colored light.

9. The illumination device according to claim 7, wherein the first, second, and third pluralities of LED dies emit red, blue, and green radiation in concert to generate white light.

10. The illumination device according to claim 1, wherein the second plurality of radiation generating sources emits infrared radiation.

11. The illumination device according to claim 1, further comprising:
    at least one first output optical element to direct output radiation from the second ends of the first plurality of optical waveguides along a first path; and
    at least one second output optical element to direct output radiation from the second ends of the second plurality of optical waveguides along a second path.

12. A vehicular illumination system comprising the illumination device according to claim 1, wherein the first plurality of radiation generating sources is illuminatable for a low beam illumination.

13. The vehicular illumination system according to claim 12, wherein both the first and the second plurality of radiation generating sources are illuminated for a high beam illumination.

14. A vehicular illumination system comprising the illumination device according to claim 1, further comprising at least one of an infrared sensor and an infrared communications transceiver.

15. An illumination device, comprising:
   a plurality of solid state radiation sources to generate optical radiation;
   a plurality of optical fibers, wherein each of the plurality of optical fibers includes a first end and a second end, wherein each first end is in optical communication with a corresponding solid state radiation source of the plurality of solid state radiation sources; and
   a plurality of non-refractive optical elements, wherein each optical element of the plurality of optical elements is interposed between a corresponding first end and the corresponding solid state radiation source, and wherein each non-refractive optical element is shaped to reflect concentrated light emitted by a corresponding solid state radiation source into a corresponding optical fiber.

16. The illumination device according to claim 15, wherein the plurality of solid state radiation sources comprise at least one of an array of vertical cavity surface emitting lasers and an array of LED dies.

* * * * *